US 10,439,596 B2

(12) United States Patent
Iida

(10) Patent No.: US 10,439,596 B2
(45) Date of Patent: Oct. 8, 2019

(54) INPUT CIRCUIT

(71) Applicant: SOCIONEXT INC., Kanagawa (JP)

(72) Inventor: Masahisa Iida, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/160,238

(22) Filed: Oct. 15, 2018

(65) Prior Publication Data

US 2019/0081616 A1 Mar. 14, 2019

Related U.S. Application Data

(63) Continuation of application No. PCT/JP2017/006201, filed on Feb. 20, 2017.

(30) Foreign Application Priority Data

Apr. 25, 2016 (JP) .................. 2016-087034

(51) Int. Cl.
H03K 3/00 (2006.01)
H03K 3/012 (2006.01)
H03K 17/687 (2006.01)
H03K 19/0185 (2006.01)
H03K 19/20 (2006.01)

(52) U.S. Cl.
CPC .......... *H03K 3/012* (2013.01); *H03K 17/687* (2013.01); *H03K 19/018521* (2013.01); *H03K 19/20* (2013.01); *H03K 2217/0081* (2013.01)

(58) Field of Classification Search
CPC ............ H03K 3/356113; H03K 3/012; H03K 17/687; H03K 19/00315; H03K 19/018521; H03K 19/018528; H03K 19/20; H03K 2217/0081
See application file for complete search history.

(56) References Cited

U.S. PATENT DOCUMENTS 5,646,809 A 7/1997 Motley et al.
5,894,230 A * 4/1999 Voldman .......... H03K 19/00315
326/81

(Continued)

FOREIGN PATENT DOCUMENTS

JP H09-121150 A 5/1997
JP H11-243330 A 9/1999
JP 2001-251176 A 9/2001

OTHER PUBLICATIONS

International Search Report and Written Opinion issued in International Patent Application No. PCT/JP2017/006201, dated May 16, 2017; with partial English translation.

*Primary Examiner* — Long Nguyen
(74) *Attorney, Agent, or Firm* — McDermott Will & Emery LLP

(57) ABSTRACT

In order to reduce a signal propagation delay when an input signal falls, an NMOS transistor (M1) is connected between an input terminal (1) receiving a signal having an amplitude of 3.3 V and an input of an inverter (INV1). A first PMOS transistor (M2) having a low drive capability and a second PMOS transistor (M4) having a high drive capability are connected in parallel between a power supply terminal (VDD 18) supplying 1.8 V and a gate of the NMOS transistor (M1). A gate of the first PMOS transistor (M2) is connected to the input of the inverter (INV1). A gate of the second PMOS transistor (M4) is connected to an output of the inverter (INV1).

7 Claims, 6 Drawing Sheets

(56) References Cited

U.S. PATENT DOCUMENTS 6,194,943 B1    2/2001  Yoshizaki et al.
7,652,518 B2 *  1/2010  Takiba ................ G06F 13/4072
                                                        327/333

* cited by examiner

INPUT CIRCUIT

CROSS-REFERENCE TO RELATED APPLICATIONS

This is a continuation of International Application No. PCT/JP2017/006201 filed on Feb. 20, 2017, which claims priority to Japanese Patent Application No. 2016-087034 filed on Apr. 25, 2016. The entire disclosures of these applications are incorporated by reference herein.

BACKGROUND

The present disclosure relates to an input circuit to be suitably used for a semiconductor integrated circuit.

As a conventional semiconductor integrated circuit including a metal-oxide-semiconductor (MOS) transistor, a known input circuit is capable of inputting a signal larger in amplitude than a power supply voltage. For example, a known input circuit includes: an input terminal receiving an input signal; a power supply terminal for supplying a power supply voltage; an inverter; an N-channel MOS (NMOS) transistor having one end connected to the input terminal and another end connected to an input of the inverter and acting as a signal transfer transistor; and a P-channel MOS (PMOS) transistor having one end connected to the power supply terminal, another end connected to the input of the inverter, and a gate connected to an output of the inverter, and acting as a feedback transistor, wherein, between the power source terminal and the gate of the signal transfer transistor, a hold-clamp circuit is connected in order to cope with the power supply voltage falling and reduce a propagation delay of the input signal. The hold-clamp circuit includes: a diode-connected NMOS transistor; a high-resistive element; and a diode-connected PMOS transistor all of which are connected in parallel. (See Japanese Unexamined Patent Publication No. H11-243330.)

In the above conventional technique, the gate voltage of the signal transfer transistor is not always held constant to the power supply voltage by the high-resistive element. Moreover, when the input signal rises, a voltage clamping operation of the diode-connected NMOS transistor stops at a certain point the rise of the voltage of the gate of the signal transfer transistor. When the input signal falls, the voltage clamping operation of the diode-connected PMOS transistor stops at a certain point the fall of the voltage of the gate of the signal transfer transistor. However, when the input signal falls, the gate voltage of the signal transfer transistor inevitably falls, causing an inevitable propagation delay of the input signal.

SUMMARY

The present disclosure reduces a signal propagation delay observed when an input signal falls.

An input circuit of the present disclosure includes: a power supply terminal for supplying a power supply voltage; an input terminal receiving a signal; a first inverter having an input and an output; a first NMOS transistor having a gate, one of a source and a drain connected to the input terminal, and another one of the source and the drain connected to the input of the first inverter; a first PMOS transistor having: a source connected to the power supply terminal; a drain connected to the gate of the first NMOS transistor; and a gate connected to the input of the first inverter; and a second PMOS transistor having: a source connected to the power supply terminal; a drain connected to the gate of the first NMOS transistor; and a gate connected to the output of the first inverter, wherein a drive capacity of the second PMOS transistor is higher than a drive capability of the first PMOS transistor.

In the present disclosure, the input of the first inverter is low when the input signal rises. Since the first PMOS transistor with low drive capability transits to on-state, the voltage of the gate of the first NMOS transistor is not held constant at a voltage substantially equal to the power supply voltage. Hence, when the input signal rises, the voltage of the gate of the first NMOS transistor can temporarily rise high, allowing the input circuit to operate at high speed. Meanwhile, the output of the first inverter is low when the input signal falls. Since the second PMOS transistor with high drive capability transits to on-state, the voltage of the gate of the first NMOS transistor is held constant at a voltage substantially equal to the power supply voltage. Hence, when the input signal falls, the voltage of the gate of the first NMOS transistor remains unchanged. As a result, a signal propagation delay is reduced.

DETAILED DESCRIPTION

Two embodiments of the present disclosure will be described in detail below, with reference to the drawings.

First Embodiment

Figure 1:
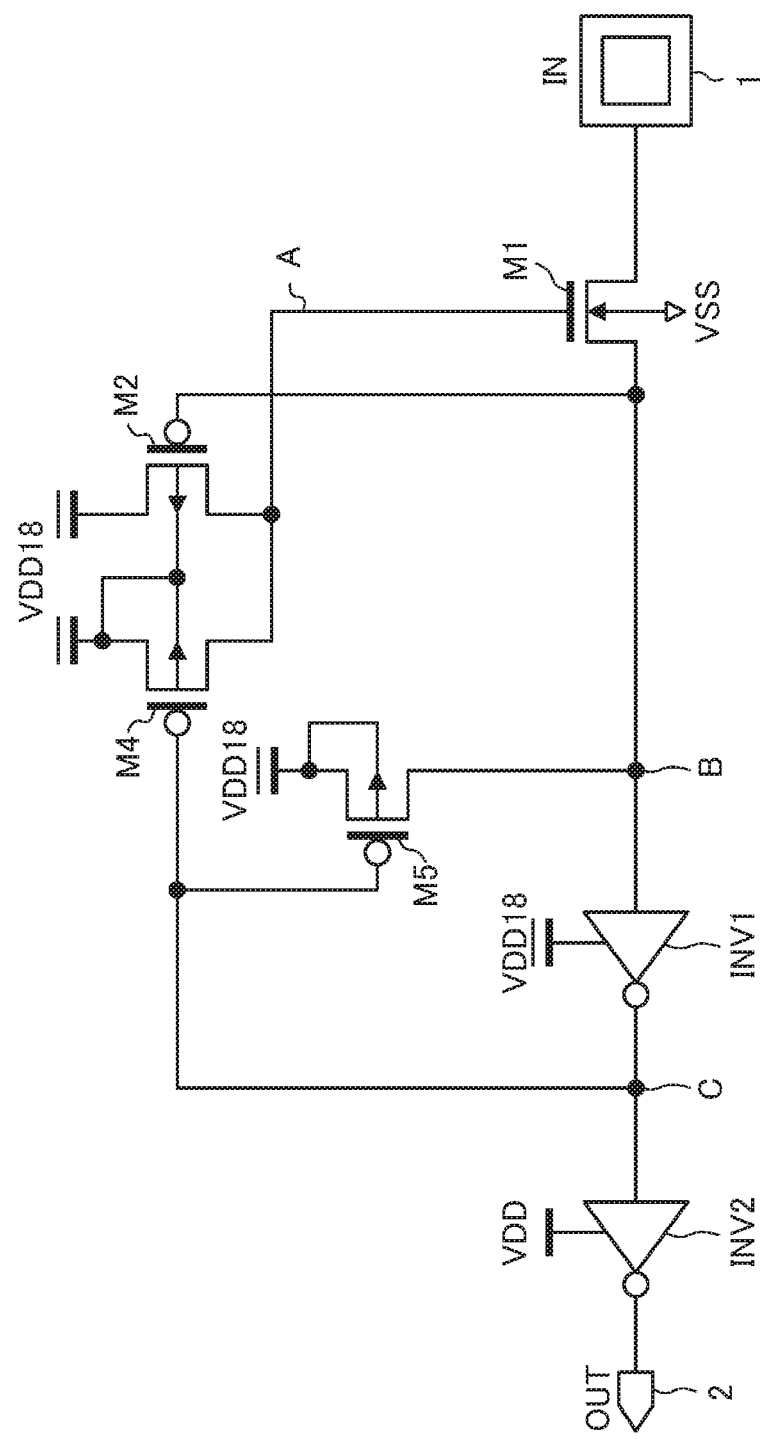
FIG. 1 is a circuit diagram showing an input circuit according to a first embodiment.

FIG. 1 is a circuit diagram showing an input circuit according to a first embodiment. The input circuit in FIG. 1 includes: an input terminal 1 receiving an input signal IN having an amplitude of 3.3 V; an output terminal 2 for outputting an output signal OUT having an amplitude of 0.9 V; a power supply terminal VDD18 for supplying a power supply voltage of 1.8 V; a first NMOS transistor M1; a first PMOS transistor M2; a second PMOS transistor M4; a third PMOS transistor M5; a first inverter INV1; and a second inverter INV2. The first NMOS transistor M1 has: a source connected to the input terminal 1; a drain connected to a gate of the first PMOS transistor M2, to a drain of the third PMOS transistor M5, and to an input of the first inverter INV1; a gate connected to the drain of the first PMOS transistor M2 and the drain of the second PMOS transistor M4; and a backgate connected to a ground potential VSS. The first PMOS transistor M2 has a source and a backgate connected to the power supply terminal VDD18. The second PMOS transistor M4 has: a source and a backgate connected to the power supply terminal VDD18; and a gate connected to a gate of the third PMOS transistor M5, to an output of the first inverter INV1, and to an input of the second inverter INV2. The third PMOS transistor M5 has a source and a backgate connected to the power supply terminal VDD18.

The second inverter INV2 has an output connected an output terminal 2. The first inverter INV1 is driven by a voltage of 1.8 V to be supplied from the power supply terminal VDD18. The second inverter INV2 is driven by an internal power supply voltage VDD of 0.9 V. Here, each of the first NMOS transistor M1, the first PMOS transistor M2, the second PMOS transistor M4, the third PMOS transistor M5, the first inverter INV1, and the second inverter INV2 is an MOS transistor having a breakdown voltage of 1.8 V; that is, the MOS transistor includes a gate oxide film having a breakdown voltage of approximately 1.8 V. Moreover, the gate width of the second PMOS transistor M4 is set wider than that of the first PMOS transistor M2 so that the drive capability of the second PMOS transistor M4 is higher than that of the first PMOS transistor M2.

In the description below, a connection node for the gate of the first NMOS transistor M1 and the drains of the first and second PMOS transistors M2 and M4 is referred to as a node A. Moreover, a connection node for the drain of the first NMOS transistor M1, the gate of the first PMOS transistor M2, the drain of the third PMOS transistor M5, and the input of the first inverter INV1 is referred to as a node B. Furthermore, a connection node for the gates of the second and third PMOS transistors M4 and M5, the output of the first inverter INV1, and the input of the second inverter INV2 is referred to as a node C.

Figure 2:
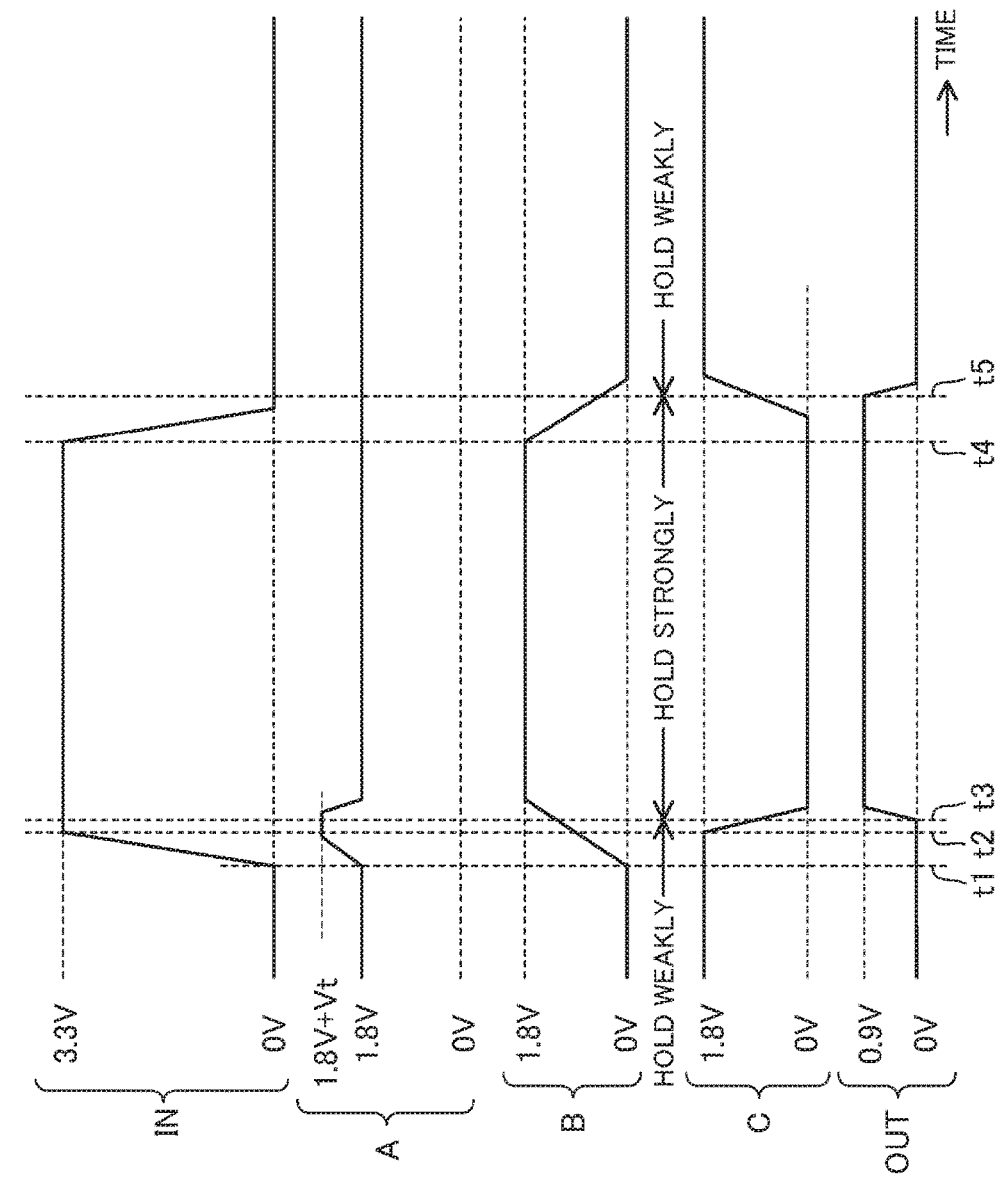
FIG. 2 is a timing diagram showing an operation of the input circuit of FIG. 1.

FIG. 2 is a timing diagram showing an operation of the input circuit of FIG. 1. In an initial state before a time t1, the voltage of the input signal IN is 0 V, the voltage of the node A is 1.8 V, the voltage of the node B is 0 V, the voltage of the node C is 1.8 V, and the voltage of the output signal OUT is 0 V. In this state, the first PMOS transistor M2 is in on-state, and both of the second and third PMOS transistors M4 and M5 are in off-state.

First, an operation when the input signal IN rises is described. At the time t1, the input signal IN starts rising. Then, because of behavior of the capacity of gate oxide film and the source-gate coupling capacity of the on-state first NMOS transistor M1, the voltage of the node A rises. In this state, when a threshold voltage of the MOS transistor is Vt, the voltage clamping operation of a drain-substrate parasitic diode for each of the first and second PMOS transistors M2 and M4 stops the voltage rise of the node A at 1.8 V+Vt. Moreover, in this state, the voltage of the node A; that is, the gate voltage of the first NMOS transistor M1 rises to 1.8 V+Vt. Hence, the voltage of the node B quickly rises to 1.8 V+Vt−Vt=1.8 V. In response to the voltage rise of the node B, because of behavior of the first inverter INV1, the voltage of the node C starts to fall at a time t2, and immediately comes down to 0 V. Moreover, the first PMOS transistor M2 transits from on-state to off-state. Meanwhile, in response to the voltage fall of the node C, because of the behavior of the second inverter INV2, the voltage of the output signal OUT starts to rise at a time t3, and immediately comes to 0.9 V. Whereas, both of the second and third PMOS transistors M4 and M5 transit from off-state to on-state. As a result, the second PMOS transistor M4 decreases the voltage of the node A to 1.8 V, and the third PMOS transistor M5 holds the voltage of the node B at 1.8 V.

In a steady-state after the rise of the output signal OUT, the voltage of the input signal IN is 3.3 V, the voltage of the node A is 1.8 V, the voltage of the node B is 1.8 V, the voltage of the node C is 0 V, and the voltage of the output signal OUT is 0.9 V. In this state, the first PMOS transistor M2 is in off-state, and both of the second and third PMOS transistors M4 and M5 are in on-state.

Next, an operation when the input signal IN falls is described. At a time t4, the input signal IN starts falling. Then, because of behavior of the source-gate coupling capacity of the first NMOS transistor M1, the voltage of the node A is likely to fall. However, the drive capability of the second PMOS transistor M4 is higher than that of the first PMOS transistor M2, and the voltage of the node A maintains at nearly 1.8 V. Meanwhile, a conductive channel is formed on the first NMOS transistor M1, such that the voltage of the node B starts to fall, reflecting the fall of the input signal IN, and comes down to 0 V. In response to the voltage fall of the node B, because of behavior of the first inverter INV1, the voltage of the node C starts to rise, and immediately reaches 1.8 V. Moreover, the first PMOS transistor M2 transits from off-state to on-state, and behaves to hold the voltage of the node A at 1.8 V. Meanwhile, in response to the voltage rise of the node C, because of behavior of the second inverter INV2, the voltage of the output signal OUT starts to fall at a time t5, and immediately comes down to 0 V. Whereas, both of the second and third PMOS transistors M4 and M5 transit from on-state to off-state. Even though the second PMOS transistor M4 transits to off-state, the voltage of the node A is already held by the first PMOS transistor M2 at 1.8 V and thus remains unchanged.

As can be seen, during the periods before the time t3 and after the time t5, the voltage of the node C is high (1.8 V) and the second PMOS transistor M4 with high drive capability transits to off-state. Meanwhile, since the voltage of the node B is low (0 V), the first PMOS transistor M2 with low drive capability transits to on-state such that the voltage of the node A is held weakly at 1.8 V. Hence, when the input signal IN rises, the voltage of the node A temporarily rises higher than 1.8 V, allowing the input circuit to operate at high speed.

Meanwhile, during the period between the time t3 and the time t5, the voltage of the node C is low (0 V) and the second PMOS transistor M4 with high drive capability transits to on-state. Hence, the voltage of the node A is held strongly at 1.8 V. Hence, when the input signal IN falls, the voltage of the node A remains unchanged at 1.8 V. As a result, a signal propagation delay is reduced.

Note that the difference in the drive capability between the first PMOS transistor M2 and the second PMOS transistor M4 can be achieved by the difference of the gate widths as described before. Alternatively, the difference in the drive capability may also be achieved by replacing the first PMOS transistor M2 with serially connected multiple PMOS transistors so that the drive capability of the first PMOS transistor M2 decreases.

Figure 3:
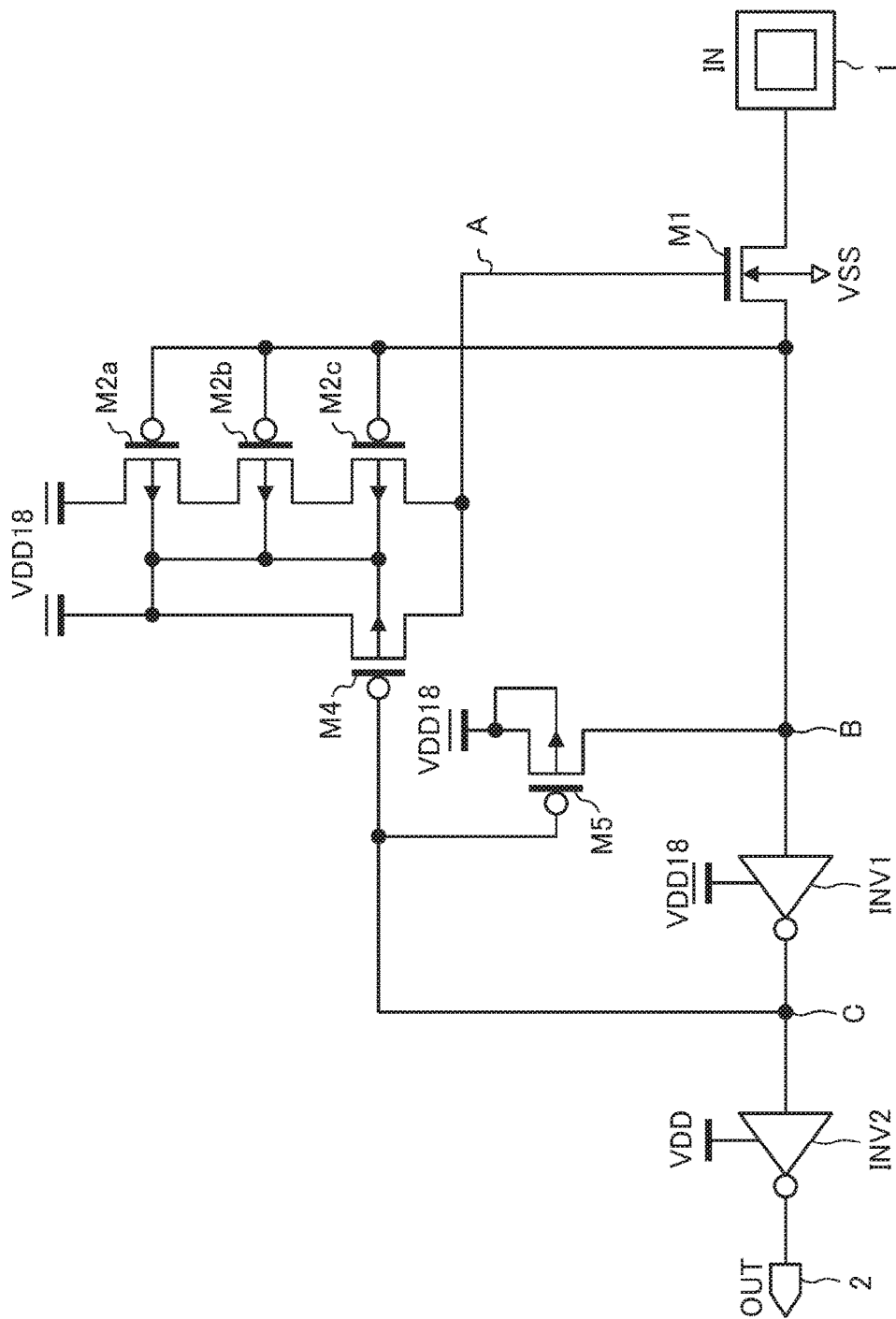
FIG. 3 is a circuit diagram showing a modification of the input circuit in FIG. 1.

FIG. 3 is a circuit diagram showing a modification of the input circuit in FIG. 1. In FIG. 3, the first PMOS transistor M2 in FIG. 1 is replaced with multiple PMOS transistors M2a, M2b, and M2c connected in series. The PMOS transistors M2a, M2b, and M2c each have a gate width substantially equivalent to a gate width of the second PMOS transistor M4. The gate of each of the PMOS transistors M2a, M2b, and M2c is commonly connected to the node B. These PMOS transistors M2a, M2b, and M2c are also MOS transistors having a breakdown voltage of 1.8 V.

Second Embodiment

Figure 4:
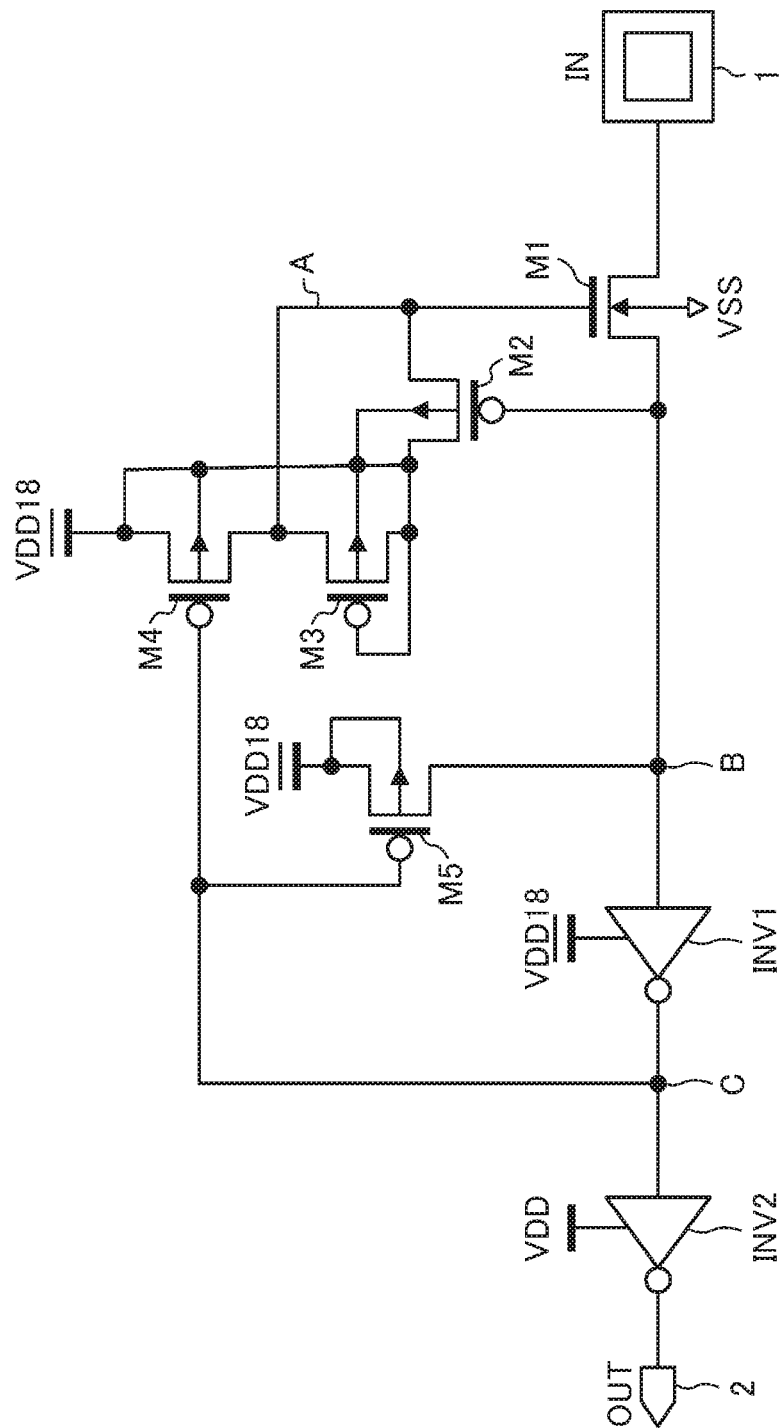
FIG. 4 is a circuit diagram showing an input circuit according to a second embodiment.

FIG. 4 is a circuit diagram showing an input circuit according to a second embodiment. The configuration in FIG. 4 is that of FIG. 1 additionally including a diode-connected fourth PMOS transistor M3. The fourth PMOS transistor M3 has: a source connected to the node A; and a drain, a gate, and a backgate connected to the power supply terminal VDD18. This fourth PMOS transistor M3 is also an MOS transistor having a breakdown voltage of 1.8 V.

According to the second embodiment, the diode-connected fourth PMOS transistor M3 carries out a voltage clamping operation to reduce a voltage rise of the node A to 1.8 V+Vt when the input signal IN rises. Compared to the input circuit in the first embodiment, the input circuit in the second embodiment additionally includes the fourth PMOS transistor M3 as an element dedicated to clamping. Such a feature allows the circuit to be designed more freely.

Figure 5:
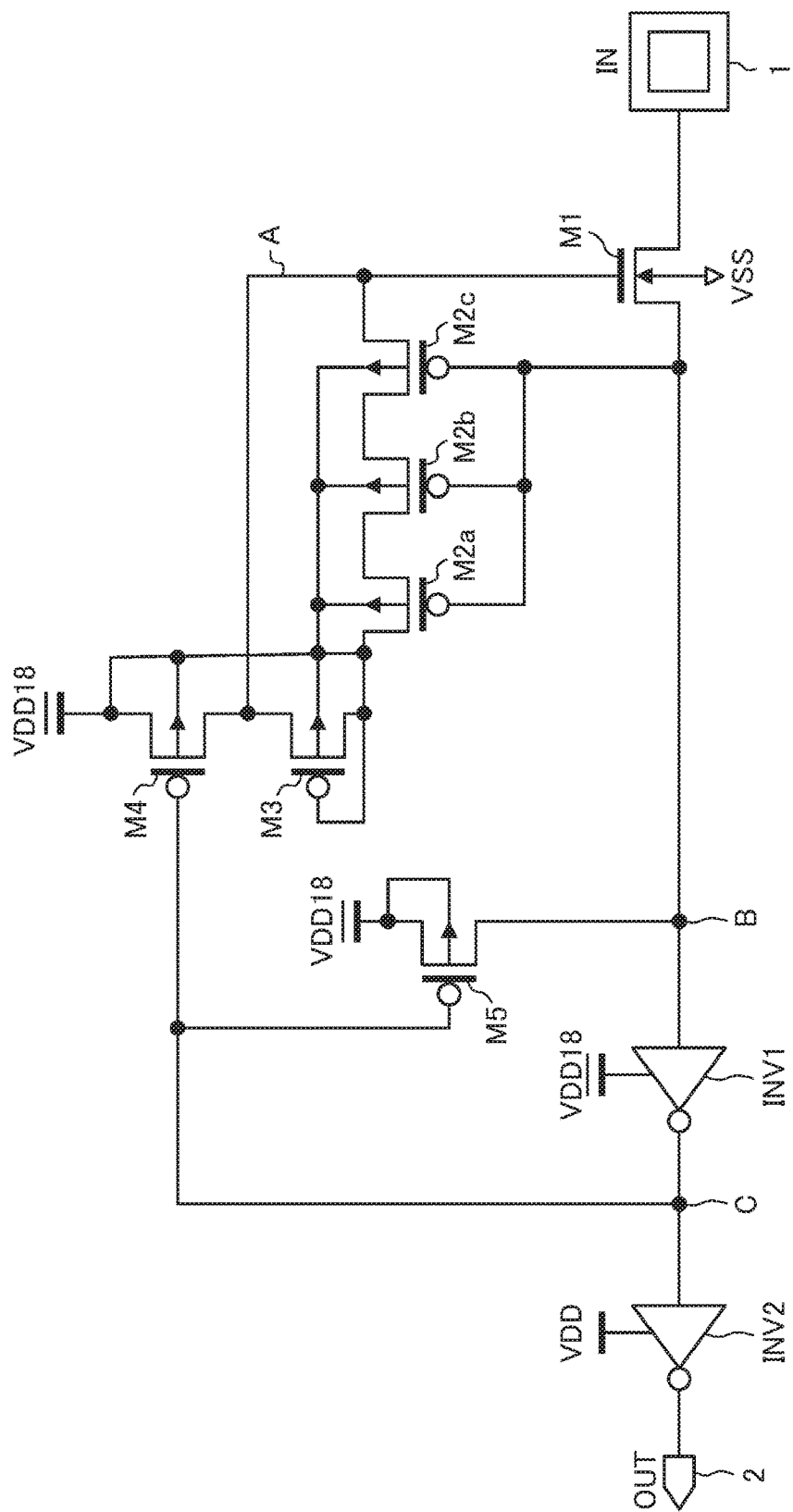
FIG. 5 is a circuit diagram showing a first modification of the input circuit in FIG. 4.

FIG. 5 is a circuit diagram showing a first modification of the input circuit in FIG. 4. In FIG. 5, the first PMOS transistor M2 in FIG. 4 is replaced with multiple PMOS transistors M2a, M2b, and M2c connected together in series. A gate width of each of the PMOS transistors M2a, M2b, and M2c is substantially the same as that of the second PMOS transistor M4. The gates of the respective PMOS transistors M2a, M2b, and M2c are commonly connected to the node B. These PMOS transistors M2a, M2b, and M2c are also MOS transistors having a breakdown voltage of 1.8 V.

The voltage clamping operation can be carried out by a diode-connected PMOS transistor, and also by a diode-connected NMOS transistor.

Figure 6:
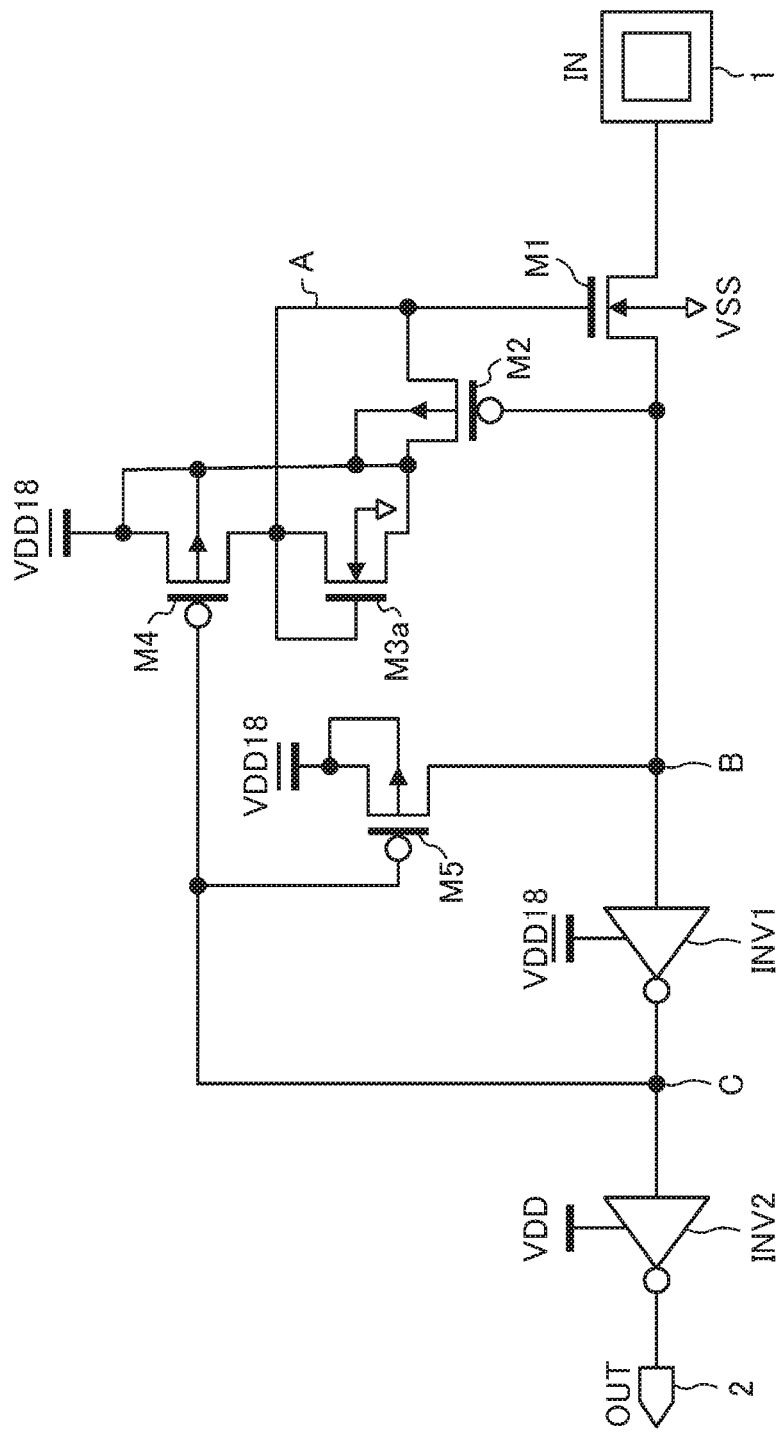
FIG. 6 is a circuit diagram showing a second modification of the input circuit in FIG. 4.

FIG. 6 is a circuit diagram showing a second modification of the input circuit in FIG. 4. In FIG. 6, the fourth PMOS transistor M3 in FIG. 4 is replaced with a diode-connected second NMOS transistor M3a. The second NMOS transistor M3a has: a drain and a gate connected to the node A, a source connected to the power supply terminal VDD18, and a backgate connected to a ground potential. This second PMOS transistor M3a is also an MOS transistor having a breakdown voltage of 1.8 V.

Note that the first PMOS transistor M2 in FIG. 6 can be replaced with multiple PMOS transistors connected in series.

As can be seen, the input circuit according to the present disclosure achieves an effect of reducing a signal propagation delay when an input signal falls. The input circuit is useful as, for example, an input circuit suitably used for a semiconductor integrated circuit.

What is claimed is:

1. An input circuit comprising:
    a power supply terminal for supplying a power supply voltage;
    an input terminal receiving a signal;
    a first inverter having an input and an output;
    a first NMOS transistor having a gate, one of a source and a drain connected to the input terminal, and another one of the source and the drain connected to the input of the first inverter;
    a first PMOS transistor having: a source connected to the power supply terminal; a drain connected to the gate of the first NMOS transistor; and a gate connected to the input of the first inverter; and
    a second PMOS transistor having: a source connected to the power supply terminal; a drain connected to the gate of the first NMOS transistor; and a gate connected to the output of the first inverter, wherein
    a drive capability of the second PMOS transistor is higher than a drive capability of the first PMOS transistor.

2. The input circuit of claim 1, further comprising a third PMOS transistor having: a source connected to the power supply terminal; a drain connected to the input of the first inverter; and a gate connected to the output of the first inverter.

3. The input circuit of claim 1, wherein a gate width of the second PMOS transistor is wider than a gate width of the first PMOS transistor.

4. The input circuit of claim 1, wherein the first PMOS transistor includes a plurality of PMOS transistors connected together in series, the PMOS transistors each having a gate width substantially equivalent to a gate width of the second PMOS transistor, and the gate of each of the PMOS transistors being connected to the input of the first inverter.

5. The input circuit of claim 1, further comprising a second inverter having an input connected to the output of the first inverter, and driven by an internal power supply voltage lower than the power supply voltage supplied to the first inverter.

6. The input circuit of claim 1, further comprising a fourth PMOS transistor having a source connected to the gate of the first NMOS transistor, and a drain and a gate both connected to the power supply terminal.

7. The input circuit of claim 1, further comprising a second NMOS transistor having a source connected to the power supply terminal, and a drain and a gate both connected to the gate of the first NMOS transistor.

* * * * *